United States Patent
Park et al.

(10) Patent No.: US 9,627,518 B2
(45) Date of Patent: Apr. 18, 2017

(54) POWER INTEGRATED DEVICES, ELECTRONIC DEVICES INCLUDING THE SAME AND ELECTRONIC SYSTEMS INCLUDING THE SAME

(71) Applicant: SK hynix Inc., Gyeonggi-do (KR)

(72) Inventors: Joo Won Park, Chungcheongbuk-do (KR); Kwang Sik Ko, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 9 days.

(21) Appl. No.: 14/567,521

(22) Filed: Dec. 11, 2014

(65) Prior Publication Data

US 2015/0380402 A1    Dec. 31, 2015

(30) Foreign Application Priority Data

Jun. 27, 2014 (KR) .................. 10-2014-0080091

(51) Int. Cl.

| H01L 27/088 | (2006.01) |
| H01L 29/78 | (2006.01) |
| H01L 29/06 | (2006.01) |
| H01L 29/739 | (2006.01) |
| H01L 29/10 | (2006.01) |
| H01L 29/08 | (2006.01) |

(52) U.S. Cl.
CPC ........ *H01L 29/7393* (2013.01); *H01L 29/063* (2013.01); *H01L 29/0649* (2013.01); *H01L 29/0653* (2013.01); *H01L 29/7816* (2013.01); *H01L 29/7835* (2013.01); *H01L 29/0878* (2013.01); *H01L 29/1083* (2013.01)

(58) Field of Classification Search
USPC ..................................................... 257/331
See application file for complete search history.

(56) References Cited

U.S. PATENT DOCUMENTS

| 6,211,003 | B1* | 4/2001 | Taniguchi ......... H01L 21/76229 |
| | | | 257/E21.548 |
| 2010/0213545 | A1* | 8/2010 | Kho ..................... H01L 29/0692 |
| | | | 257/339 |
| 2011/0127602 | A1* | 6/2011 | Mallikarjunaswamy |
| | | | .................... H01L 21/823807 |
| | | | 257/331 |
| 2012/0043608 | A1* | 2/2012 | Yang .................... H01L 29/0653 |
| | | | 257/336 |
| 2013/0256794 | A1* | 10/2013 | Lee ...................... H01L 29/7816 |
| | | | 257/339 |

FOREIGN PATENT DOCUMENTS

| KR | 1020100063576 | 6/2010 |
| KR | 1020110078861 | 7/2011 |

* cited by examiner

*Primary Examiner* — Julio J Maldonado
*Assistant Examiner* — Lawrence Tynes, Jr.
(74) *Attorney, Agent, or Firm* — IP & T Group LLP (57) ABSTRACT

A power integrated device includes a gate electrode on a substrate, a source region and a drain region disposed in the substrate at two opposite sides of the gate electrode, a drift region disposed in the substrate between the gate electrode and the drain region to be spaced apart from the source region, and a plurality of insulating stripes disposed in an upper region of the drift region to define at least one active stripe therebetween. Related electronic devices and related electronic systems are also provided.

19 Claims, 4 Drawing Sheets

POWER INTEGRATED DEVICES, ELECTRONIC DEVICES INCLUDING THE SAME AND ELECTRONIC SYSTEMS INCLUDING THE SAME

CROSS-REFERENCE TO RELATED APPLICATION

The present application claims priority under 35 U.S.C. 119(a) to Korean Application No. 10-2014-0080091, filed on Jun. 27, 2014, in the Korean intellectual property Office, which is herein incorporated by reference in its entirety.

BACKGROUND

1. Technical Field

Various embodiments relate to integrated circuits and, more particularly, to power integrated devices, electronic devices including the same and electronic systems including the same.

2. Related Art

Integrated circuits performing both functions of a controller and a driver may be employed in smart power devices. Power devices may include a MOS transistor that can operate at high voltages, which are in the range of tens of volts. The smart power device may have an output circuit which is designed to include a power integrated device such as a lateral double diffused MOS (LDMOS) transistor operating at high voltage.

SUMMARY

Various embodiments are directed to power integrated devices, electronic devices including the same, and electronic systems including the same.

According to an embodiment, a power integrated device includes a gate electrode on a substrate, a source region and a drain region disposed in the substrate at two opposite sides of the gate electrode, a drift region disposed in the substrate between the gate electrode and the drain region to be spaced apart from the source region, and a plurality of insulating stripes disposed in an upper region of the drift region to define at least one active stripe therebetween.

According to another embodiment, a power integrated device includes a drift region of a first conductivity type and a body region of a second conductivity type disposed in a substrate of the second conductivity type, a source region of the first conductivity type disposed in an upper region of the body region, a gate electrode disposed on a top surface of the body region between the source region and the drift region, a drain region of the first conductivity type disposed in an upper region of the drift region to be spaced apart from the gate electrode, and a plurality of insulating stripes disposed in an upper region of the drift region to define at least one active stripe therebetween. The at least one active stripe is defined to be parallel with the drain region.

According to another embodiment, a power integrated device includes a drift region of a first conductivity type and a body region of a second conductivity type disposed in a substrate of the second conductivity type, a top region of the second conductivity type disposed in an upper region of the drift region, a source region of the first conductivity type disposed in an upper region of the body region, a gate electrode disposed on a top surface of the body region between the source region and the drift region, a drain region of the first conductivity type disposed in an upper region of the drift region to be spaced apart from the gate electrode, and a plurality of insulating stripes disposed in an upper region of the top region to define at least one active stripe therebetween. The at least one active stripe is defined to be parallel with the drain region.

According to another embodiment, an electronic device includes a high voltage integrated circuit suitable for generating an output signal in response to an input signal and a power integrated device suitable for executing a switching operation according to the output signal of the high voltage integrated circuit. The power integrated device includes a gate electrode on a substrate, a source region and a drain region disposed in the substrate at two opposite sides of the gate electrode, a drift region disposed in the substrate between the gate electrode and the drain region to be spaced apart from the source region, and a plurality of insulating stripes disposed in an upper region of the drift region to define at least one active stripe therebetween.

According to another embodiment, an electronic device includes a high voltage integrated circuit suitable for generating an output signal in response to an input signal and a power integrated device suitable for executing a switching operation according to the output signal of the high voltage integrated circuit. The power integrated device includes a drift region of a first conductivity type and a body region of a second conductivity type disposed in a substrate of the second conductivity type, a source region of the first conductivity type disposed in an upper region of the body region, a gate electrode disposed on a top surface of the body region between the source region and the drift region, a drain region of the first conductivity type disposed in an upper region of the drift region to be spaced apart from the gate electrode, and a plurality of insulating stripes disposed in an upper region of the drift region to define at least one active stripe therebetween. The at least one active stripe is defined to be parallel with the drain region.

According to another embodiment, an electronic device includes a high voltage integrated circuit suitable for generating an output signal in response to an input signal and a power integrated device suitable for executing a switching operation according to the output signal of the high voltage integrated circuit. The power integrated device includes a drift region of a first conductivity type and a body region of a second conductivity type disposed in a substrate of the second conductivity type, a top region of the second conductivity type disposed in an upper region of the drift region, a source region of the first conductivity type disposed in an upper region of the body region, a gate electrode disposed on a top surface of the body region between the source region and the drift region, a drain region of the first conductivity type disposed in an upper region of the drift region to be spaced apart from the gate electrode, and a plurality of insulating stripes disposed in an upper region of the top region to define at least one active stripe therebetween. The at least one active stripe is defined to be parallel with the drain region.

According to another embodiment, an electronic system includes a mobile station modem and a power management integrated circuit. The power management integrated circuit is suitable for supplying a power supply voltage to the mobile station modem and suitable for employing a power integrated device as a switching device. The power integrated device includes a gate electrode on a substrate, a source region and a drain region disposed in the substrate at two opposite sides of the gate electrode, a drift region disposed in the substrate between the gate electrode and the drain region to be spaced apart from the source region, and a plurality of insulating stripes disposed in an upper region of the drift region to define at least one active stripe therebetween.

According to another embodiment, an electronic system includes a mobile station modem and a power management integrated circuit. The power management integrated circuit is suitable for supplying a power supply voltage to the mobile station modem and suitable for employing a power integrated device as a switching device. The power integrated device includes a drift region of a first conductivity type and a body region of a second conductivity type disposed in a substrate of the second conductivity type, a source region of the first conductivity type disposed in an upper region of the body region, a gate electrode disposed on a top surface of the body region between the source region and the drift region, a drain region of the first conductivity type disposed in an upper region of the drift region to be spaced apart from the gate electrode, and a plurality of insulating stripes disposed in an upper region of the drift region to define at least one active stripe therebetween. The at least one active stripe is defined to be parallel with the drain region.

According to another embodiment, an electronic system includes a mobile station modem and a power management integrated circuit. The power management integrated circuit is suitable for supplying a power supply voltage to the mobile station modem and suitable for employing a power integrated device as a switching device. The power integrated device includes a drift region of a first conductivity type and a body region of a second conductivity type disposed in a substrate of the second conductivity type, a top region of the second conductivity type disposed in an upper region of the drift region, a source region of the first conductivity type disposed in an upper region of the body region, a gate electrode disposed on a top surface of the body region between the source region and the drift region, a drain region of the first conductivity type disposed in an upper region of the drift region to be spaced apart from the gate electrode, and a plurality of insulating stripes disposed in an upper region of the top region to define at least one active stripe therebetween. The at least one active stripe is defined to be parallel with the drain region.

According to another embodiment, a power integrated device comprises a substrate including a source region (110) and a drain region (331), a gate electrode (370) provided between the source region and the drain region, a first insulating stripe (211) provided between the gate electrode and the drain region, a well (353) extending from under the gate electrode through under the first insulating stripe (211) to the drain region, and a channel region (108) provided under the gate electrode and between the source region and the well, wherein each of the source region, the drain region, and the well has a first conductivity, and wherein the substrate has a second conductivity which is different from the first conductivity.

According to another embodiment, a power integrated device comprises a substrate including a source region (110) and a drain region (331), a gate electrode (370) provided between the source region and the drain region, a top region (391) provided between the gate electrode and the drain region, a well (353) extending from under the gate electrode through under the top region (391) to the drain region, and a channel region (108) provided under the gate electrode and between the source region and the well, wherein each of the source region, the drain region, and the well has a first conductivity, and wherein each of the substrate and the top region (391) has a second conductivity which is different from the first conductivity.

BRIEF DESCRIPTION OF THE DRAWINGS

Embodiments will become more apparent in view of the attached drawings and accompanying detailed description, in which.

DETAILED DESCRIPTION OF THE EMBODIMENTS

In the following embodiments, it will be understood that when an element is referred to as being located "on", "over", "above", "under", "beneath" or "below" another element, it may directly contact the other element, or at least one intervening element may be present therebetween. Accordingly, the terms such as "on", "over", "above", "under", "beneath", "below" and the like that are used herein are for the purpose of describing particular embodiments only and are not intended to limit the scope of the present disclosure.

In the drawings, thickness and length of components are exaggerated for convenience of illustration. In the following description, a detailed explanation of known related functions and constitutions may be omitted to avoid unnecessarily obscuring the subject manner. Furthermore, 'connected/coupled' represents that one component is directly coupled to another component or indirectly coupled through another component. In this specification, a singular form may include a plural form as long as it is not specifically mentioned in a sentence. Furthermore, "include/comprise" or "including/comprising" used in the specification represents that one or more components, steps, operations, and elements exist or are added.

According to an embodiment, insulating stripes defining active stripes in parallel to a drain region may be disposed in a drift region to improve an on-resistance characteristic and a breakdown voltage characteristic of a power integrated device. The power integrated device may include a lateral double diffused MOS (LDMOS) transistor.

In some power devices, it may be required to form LDMOS transistors operating at a relatively high voltage together with logic MOS transistors operating at a relatively low voltage on the same chip. In such a case, it may be necessary to form the LDMOS transistors and the logic MOS transistors using a complementary MOS (CMOS) process. The LDMOS transistors may be formed to have a low on-resistance value and a high breakdown voltage in order to improve their performances.

Some LDMOS transistors may be designed and formed to have a high breakdown voltage in order to operate at a high voltage. In addition, the LDMOS transistors may be designed and formed to have a low on-resistance value in order to improve its switching characteristics. However, the on-resistance and the breakdown voltage may have a trade-off relationship. Thus, it may be difficult to improve the breakdown voltages without degradation of other characteristics such as the on-resistance characteristic.

According to an embodiment, the plurality of insulating stripes defining the active stripes in parallel to the drain region may be alternately and repeatedly arrayed in an upper region of the drift region between a gate electrode and the drain region, thereby improving both the on-resistance characteristic and the breakdown voltage characteristic.

Each of the power integrated devices according to an embodiment may be realized to have a structure of an LDMOS transistor or may be realized to include an LDMOS transistor. The power integrated devices according to an embodiment may be modified such that the drift region has various forms or shapes.

In the power integrated devices, the breakdown voltage may be an important parameter in terms of stability of the power integrated devices, and the on-resistance value may be another important parameter in terms of a current drivability of the power integrated devices. In order to improve the breakdown voltage characteristic, an impurity concentration of the drift region may be reduced or a drift length of carriers in the drift region may be increased. However, in such a case, the current drivability of the power integrated devices may be degraded. Accordingly, the on-resistance value deteriorates. In contrast, if an impurity concentration of the drift region increases or a drift length of carriers in the drift region decreases, the on-resistance characteristic may be improved but the breakdown voltage characteristic may be degraded. Accordingly, the on-resistance and the drain junction breakdown voltage may be in a trade-off relationship, as described above.

The power integrated device such as the LDMOS transistor may include a shallow trench isolation layer for isolating the LDMOS transistor from other devices and a trench field insulation layer for suppressing an electric field crowding phenomenon occurring at an edge of the gate electrode which is adjacent to the drain region. In an embodiment, the insulating stripes may be formed using the trench field insulation layer to act as trench field plates.

The trench field insulation layer and the trench isolation layer may be formed by filling trenches having a predetermined depth with an insulation layer. The trench field insulation layer and the trench isolation layer may be simultaneously formed. In such a case, the trench field insulation layer may have the same depth as the trench isolation layer or may have different depth than the trench isolation layer. In either case, the trench field insulation layer employed in the conventional LDMOS transistors may have a shallow trench insulation (STI) structure whose aspect ratio is less than one. That is, a vertical height of the conventional trench field insulation layer may be less than a horizontal width of the conventional trench isolation layer.

Figure 1:
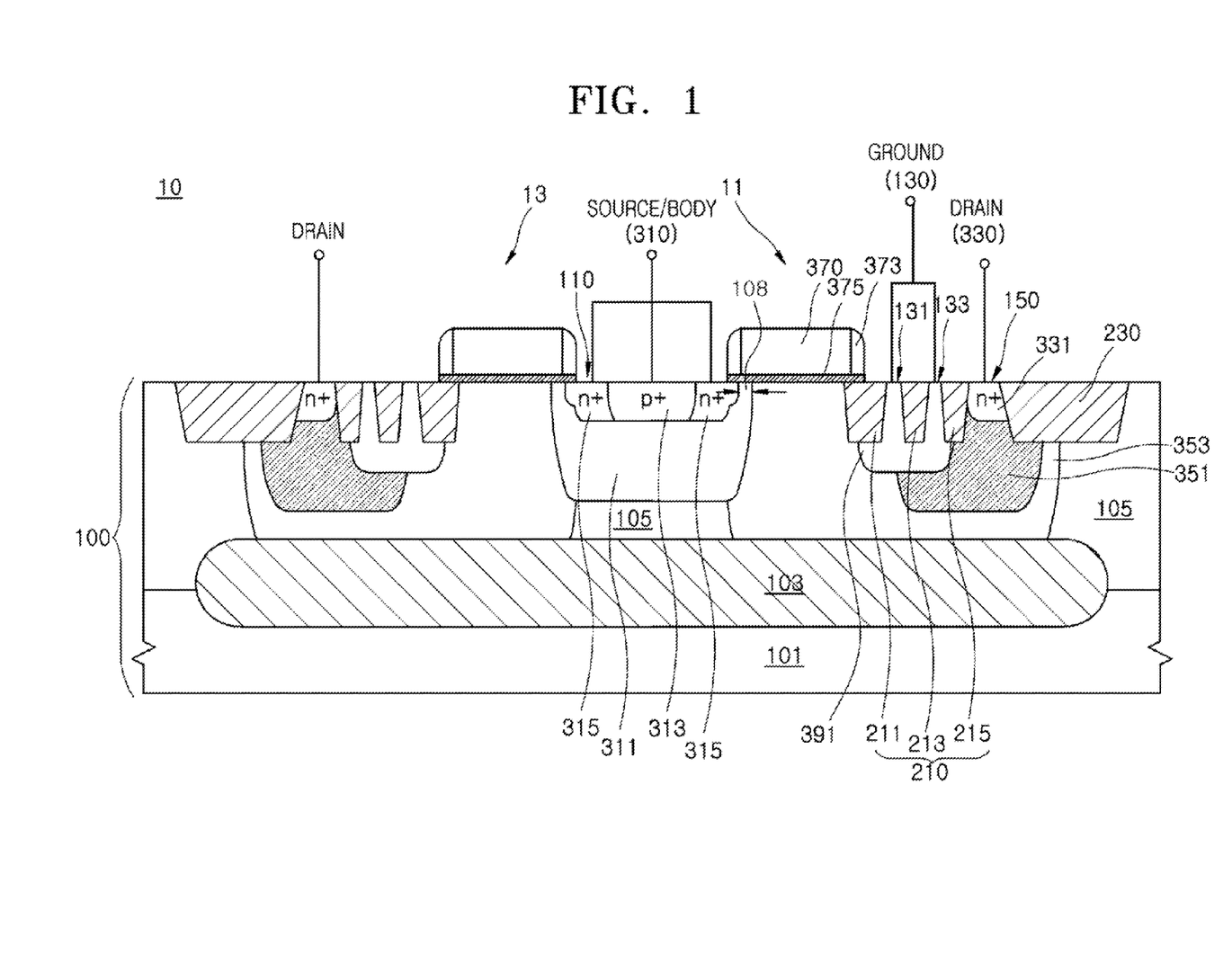
FIG. 1 is a cross-sectional view illustrating a power integrated device according to an embodiment.
Figure 2:
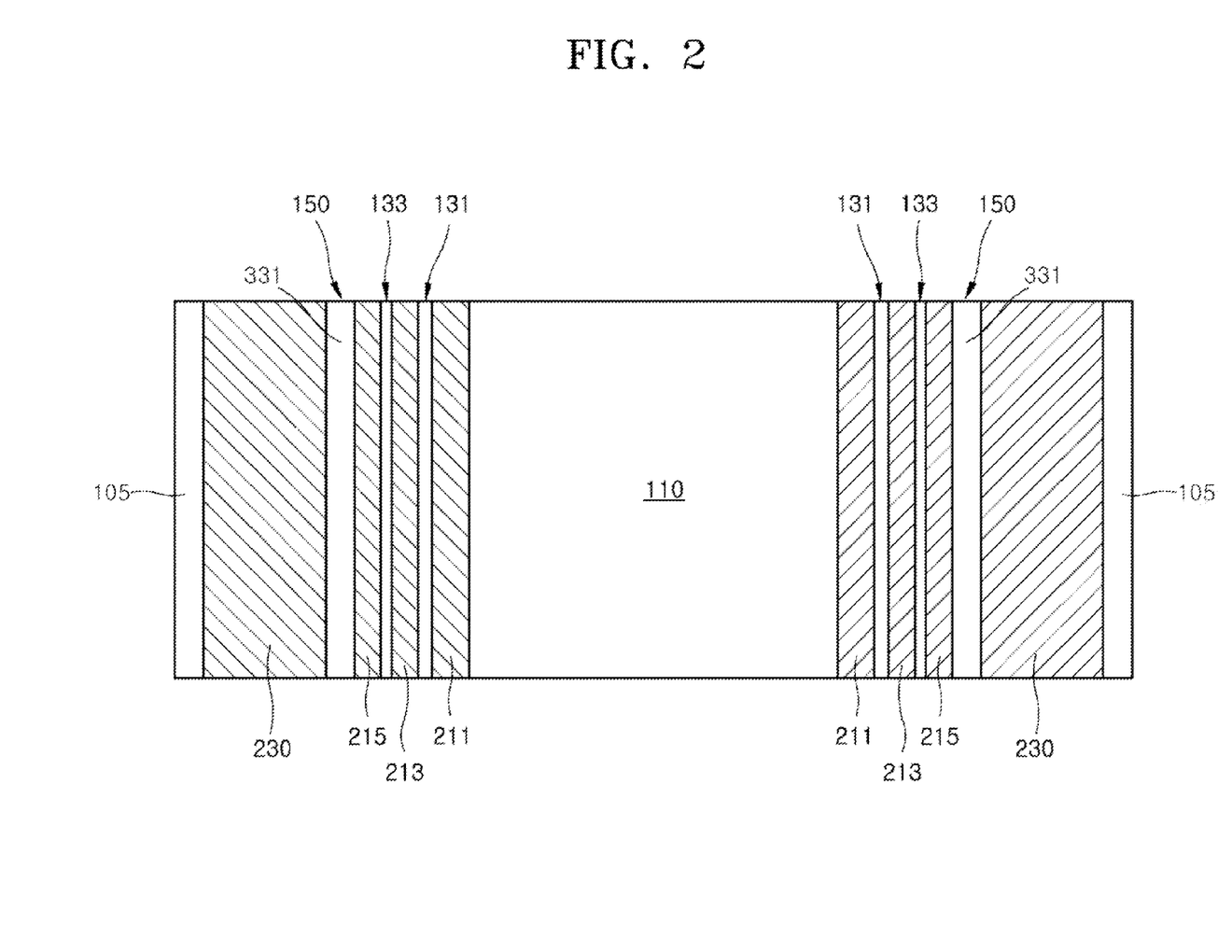
FIG. 2 is a plan view illustrating a power integrated device according to an embodiment.

FIG. 1 is a cross-sectional view illustrating a power integrated device according to an embodiment, and FIG. 2 is a plan view of the power integrated device shown in FIG. 1. The power integrated device may include an LDMOS transistor 10, as illustrated in FIGS. 1 and 2. Referring to FIGS. 1 and 2, the LDMOS transistor 10 may include a drift region 351+353 disposed in an upper region of a substrate 100 and a plurality of insulating stripes 211, 213 and 215 alternatively and repeatedly arranged in the drift region between a gate electrode 370 and an N-type drain region 331. A plurality active stripes 131 and 133 are defined between the plurality of insulating stripes 211, 213 and 215. In an embodiment, the LDMOS transistor 10 may be an N-channel LDMOS transistor, as illustrated in FIG. 1.

Although FIG. 1 illustrates an example of the N-channel LDMOS transistor, the same configuration and structure as the insulating stripes 211, 213 and 215 defining the active stripes 131 and 133 may be equally applicable to a P-channel LDMOS transistor. Moreover, the same configuration and structure as the insulating stripes 211, 213 and 215 defining the active stripes 131 and 133 may also be equally applicable to other transistors including the gate electrode 370 and the N-type drain region 331 which are spaced apart from each other.

The insulating stripes 211, 213 and 215 and active stripes 131 and 133 may be disposed substantially in parallel to the N-type drain region 331. That is, the insulating stripes 211, 213 and 215 and active stripes 131 and 133 may be disposed to extend in the direction which is parallel to the N-type drain region 331. The insulating stripes 211, 213 and 215 and active stripes 131 and 133 may also be disposed in parallel to the gate electrode 370. The insulating stripes 211, 213 and 215 and active stripes 131 and 133 may also be disposed in parallel to the drift region 351+353.

The substrate 100 may include a semiconductor substrate 101 which is doped with P-type impurities. In an embodiment, the substrate 100 may be a bulk semiconductor substrate, for example, a single crystalline silicon substrate. In another embodiment, the substrate 100 may be a silicon-on-insulator (SOI) substrate. In either case, the substrate 100 may include a semiconductor layer. In an embodiment, the semiconductor layer may include a silicon (Si) layer, a silicon carbide (SiC) layer, a silicon germanium (SiGe) layer, a silicon germanium carbide (SiGeC) layer, a germanium (Ge) layer, a gallium arsenide (GaAs) layer, an indium arsenide (InAs) layer, an indium phosphide (InP) layer, a Group III-V compound semiconductor layer, a Group II-VI compound semiconductor layer, or a combination thereof. In an embodiment, the substrate 100 may include a quartz substrate, a ceramic substrate, or an organic display substrate on which a semiconductor layer is disposed.

A P-type epitaxial layer 105 serving as a P-type well region may be disposed in the P-type semiconductor substrate 101, and an N-type buried layer 103 may be disposed between the P-type epitaxial layer 105 and the P-type semiconductor substrate 101. The P-type well region 105 may be lightly doped with P-type impurities, and the N-type buried layer 103 may be heavily doped with N-type impurities.

A P-type body region 311 may be disposed in the P-type well region 105, and the drift region 351+353 may be disposed in the P-type well region 105 to contact a sidewall of the P-type body region 311. Although not shown in the drawings, in an embodiment, the drift region 351+353 may be disposed in the P-type well region 105 to be spaced apart from the P-type body region 311. The drift region 351+353 may be configured to include an N-type first drift region 353 disposed in the P-type well region 105 to contact the N-type buried layer 103, an N-type second drift region 351 disposed in the N-type first drift region 353, and a P-type top region 391 disposed in the N-type first drift region 353 and the N-type second drift region 351 to be adjacent to an edge of the gate electrode 370. The N-type second drift region 351 may have an impurity concentration which is higher than that of the N-type first drift region 353. An N-type source region 315 may be disposed in an upper region of the P-type body region 311. The N-type source region 315 may have a lightly doped drain (LDD) region. That is, the N-type source region 315 may include an N-type main region having an impurity concentration higher than the N-type second drift region 351 and an N-type extension laterally protruding from the N-type main region toward the P-type top region 391. The N-type extension may have an impurity concentration lower than the N-type main region. A P-type body contact region 313 may be disposed in the P-type body region 311 and surrounded by the N-type source region 315. The N-type source region 315 and the P-type body contact region 313 may be electrically connected to a source/body terminal 310. The P-type body contact region 313 may have an impurity concentration higher than the P-type body region 311.

An upper region of the P-type body region 311 between the N-type source region 315 and the N-type first drift region 353 may serve as a channel region 108. A gate oxide layer 375 and the gate electrode 370 may be sequentially stacked on the channel region 108. The gate oxide layer 375 and the gate electrode 370 may extend onto the N-type first drift region 353 between the P-type top region 391 and the channel region 108. In another embodiment where the drift region 351+353 are spaced apart from the P-type body region 311, the channel region 108 may serve as a first channel region and an upper region of the P-type well region 105 between the P-type body region 311 and the N-type first drift region 353 may serve as a second channel region. However, as illustrated in FIG. 1, if the N-type first drift region 353 is disposed to directly contact the channel region 108, the second channel region may be not necessary. Sidewalls of the gate electrode 370 may be covered with a gate spacer 373 which is formed over the N-type extension of the N-type source region 315.

In another embodiment where the drift region 351+353 are spaced apart from the P-type body region 311, the gate oxide layer 375 and the gate electrode 370 may extend over the N-type first drift region 353. The drift region 351+353 may have a multi-junction structure, as illustrated in FIG. 1. That is, as described above, the drift region 351+353 may include the N-type first drift region 353 disposed in the P-type well region 105, the N-type second drift region 351 disposed in the N-type first drift region 353, and the P-type top region 391 disposed in the N-type first drift region 353 and the N-type second drift region 351.

In an embodiment, the drift portion may be configured to include only the N-type first drift region 353 and the P-type top region 391 without the N-type second drift region 351. The P-type top region 391 may induce a double reduced surface field (RESURF) effect to improve a breakdown voltage characteristic of the LDMOS transistor 10. That is, because of the presence of the P-type top region 391, depletion regions may be formed between the N-type first drift region 353 and the P-type top region 391 as well as between the N-type second drift region 351 and the P-type top region 391 to increase a drain junction breakdown voltage of the LDMOS transistor 10.

The N-type first drift region 353 may have an impurity concentration lower than the N-type second drift region 351 to serve as a lightly doped high voltage N-well. The N-type first drift region 353 may be disposed to surround sidewalls and a bottom surface of the N-type second drift region 351. As a result, a drain junction breakdown voltage characteristic of the LDMOS transistor 10 may be improved. The N-type first drift region 353 may be disposed to surround the P-type top region 391 in addition to the N-type second drift region 351. In another embodiment, the N-type first drift region 353 may be disposed to surround a bottom surface and sidewalls of the P-type body region 311.

The P-type top region 391 may laterally extend from the N-type second drift region 351 into the N-type first drift region 353 to contact a bottom surface of the insulating stripe 211 which is adjacent to the gate electrode 370. That is, the P-type top region 391 may be partially surrounded by the N-type first drift region 353 and partially surrounded by the N-type second drift region 351.

The buried layer 103 may extend from under the N-type first drift region 353 to under the P-type body region 311. In another embodiment, the buried layer 103 may have a single-layered structure heavily doped with N-type impurities. Alternatively, the buried layer 103 may have a multi-layered structure including at least one P-type layer and at least one N-type layer which are alternately and repeatedly stacked. The P-type layer and the N-type layer included in the buried layer 103 may be epitaxial layers.

The N-type drain region 331 may be disposed in an upper region of the N-type second drift region 351 and may be electrically connected to a drain terminal 330. The N-type drain region 331 may have an impurity concentration higher than the N-type second drift region 351. The N-type second drift region 351 may be disposed to surround sidewalls and a bottom surface of the N-type drain region 331. An additional N-type impurity region (not shown) may be disposed between the N-type drain region 331 and the N-type second drift region 351. The additional N-type impurity region may have an impurity concentration which is higher than that of the N-type second drift region 351 and lower than that of the N-type drain region 331.

The LDMOS transistor 10 may include a first LDMOS transistor 11 and a second LDMOS transistor 13 that share the P-type body region 311 and are symmetric to each other with respect to the P-type body region 311. In such a case, the pair of gate electrodes 370 may be electrically connected to the first and second LDMOS transistors 11 and 13, respectively. Also, a pair of drain terminals 330 may be electrically connected to the first and second LDMOS transistors 11 and 13, respectively. The first and second LDMOS transistors 11 and 13 may be connected in parallel to each other to operate as a single LDMOS transistor.

An insulating stripe structure 210 (211, 213 and 215) may be disposed in an upper region of the substrate 100 (e.g., in the P-type top region 391) between the N-type drain region 331 and the channel region 108. As illustrated in FIG. 2, the plurality of insulating stripes 211, 213 and 215 may be disposed to be parallel with each other and to define the active stripes 131 and 133 therebetween. Each of the plurality of insulating stripes 211, 213 and 215 and the plurality of active stripes 131 and 133 may have a linear shape and may extend in parallel to the N-type drain region 331 and the gate electrode 370.

An additional insulating stripe structure 210 may be disposed in an upper region of the substrate 100 to form a pair of insulating stripe structures 210. The pair of insulating stripe structures 210 may be arranged symmetrically to each other with respect to the P-type body region 311. The P-type body contact region 313, the N-type source region 315, and the channel region 108 may be disposed in a first active region 110 between the pair of insulating stripe structures 210. The insulating stripe structure 210 may be disposed to separate the gate electrode 370 or the channel region 108 from the N-type drain region 331. The N-type drain region 331 may be disposed in a second active region 150 between the insulating stripe structure 210 and an isolation layer 230 which is disposed on an edge of the N-type first drift region 353.

The isolation layer 230 may be a shallow trench isolation layer. The insulating stripe structure 210 may include the first to third separate insulating stripes 211, 213 and 215 which are arranged in parallel to each other. The number of the insulating stripes 211, 213 and 215 may vary depending on the distance between the N-type drain region 331 and the channel region 108. The insulating stripe structure 210 may induce a dielectric RESURF effect to improve a breakdown voltage characteristic of the LDMOS transistor 10. That is, the insulating stripe structure 210 may cause electron drift length, which move from the N-type source region 315 toward the N-type drain region 331 due to an electric field created by a drain voltage applied to the N-type drain region 331, to increase. Thus, drain junction breakdown voltage characteristics of the LDMOS transistor 10 improve. If the insulating stripe structure 210 depth increases, drift length of the electrons may also increase. Thus, drain junction breakdown voltage characteristics of the LDMOS transistor 10 may improve even more.

If the insulating stripes 211, 213 and 215 are formed using a shallow trench isolation (STI) process instead of a local oxidation of silicon (LOCOS) process, loss of dopants (i.e., N-type impurities) in the N-type first drift region 353 and the N-type second drift region 351 may be minimized and can suppress degradation of on-resistance characteristics of the LDMOS transistor 10. The insulating stripes 211, 213 and 215 having an STI structure may be formed by etching the substrate 100 to form trenches and by filling the trenches with a dielectric material. Thus, loss of dopants in the N-type first drift region 353 and the N-type second drift region 351 may be suppressed when the insulating stripes 211, 213 and 215 are formed using an STI process instead of a LOCOS process. This is because the LOCOS process is performed at a relatively high temperature to thermally oxidize a silicon substrate while the STI process is performed at a relatively low temperature. As a result, if the insulating stripes 211, 213 and 215 are formed using an STI process, and drain junction breakdown voltage characteristics of the LDMOS transistor 10 may be improved without degradation of on-resistance characteristics of the LDMOS transistor 10.

The gate electrode 370 may extend onto the first insulating stripe 211 to overlap with an edge of the first insulating stripe 211. In such a case, the first insulating stripe 211 may alleviate an electric field applied to the drift region under the first insulating stripe 211. That is, the first insulating stripe 211 may spread an electric field concentrated at an edge of the gate electrode adjacent to the drain region 330 to reduce the intensity of the electric field. Accordingly, the first insulating stripe 211 may increase a gate dielectric breakdown voltage and a drain junction breakdown voltage of the LDMOS transistor 10.

A width of the first insulating stripe 211 adjacent to the gate electrode 370 may be greater than widths of the second and third insulating stripes 213 and 215 adjacent to the drain region 311 such that the first insulating stripe 211 has a field overlap portion overlapping with an edge of the gate electrode 370. However, in another embodiment, the first, second, and third insulating stripes 211, 213 and 215 may have substantially the same width.

The insulating stripes 211, 213 and 215 may have an STI structure having a depth which is less than a depth of the P-type top region 391. The insulating stripes 211, 213 and 215 may be disposed in the P-type top region 391. In an embodiment, one or two of the insulating stripes 211, 213 and 215 may be may be disposed in the N-type first drift region 353 or the N-type second drift region 351.

At least one of the active stripes 131 and 133 defined between the insulating stripes 211, 213 and 215 may be disposed in the P-type top region 391. The active stripes 131 and 133 may be electrically connected to a ground terminal 130 to ground the P-type top region 391. The ground terminal 130 may electrically connect the P-type top region 391 to the P-type semiconductor substrate 101, the P-type well region 105, or an external ground source.

In FIGS. 1 and 2, it will be understood that various structures, junctions, layers, or regions are illustrated in simplified or idealized shapes. Thus, actual profiles of the junctions, layers, or regions may be modified differently from those illustrated in FIGS. 1 and 2. In addition, positions of the junctions, layers, or regions may be changed according to fabrication processes or a breakdown voltage design. Moreover, other junctions, layers, or regions may be additionally disposed in the junctions, layers, or regions to change concentration profiles of the junctions, layers, or regions.

As described above, the insulating stripe structure 210 and the active stripes 131 and 133 may be applicable to various other power devices which requires a breakdown voltage of about 60 volts or higher. For example, the insulating stripe structure 210 and the active stripes 131 and 133 may be applicable to P-channel LDMOS transistors, drain extended MOS (DEMOS) transistors, or lateral insulated gate bipolar transistors (IGBTs). In addition, the insulating stripe structure 210 and the active stripes 131 and 133 may be applicable to LDMOS transistors without the buried layer 103 or DEMOS transistors without the buried layer 103.

Figure 3:
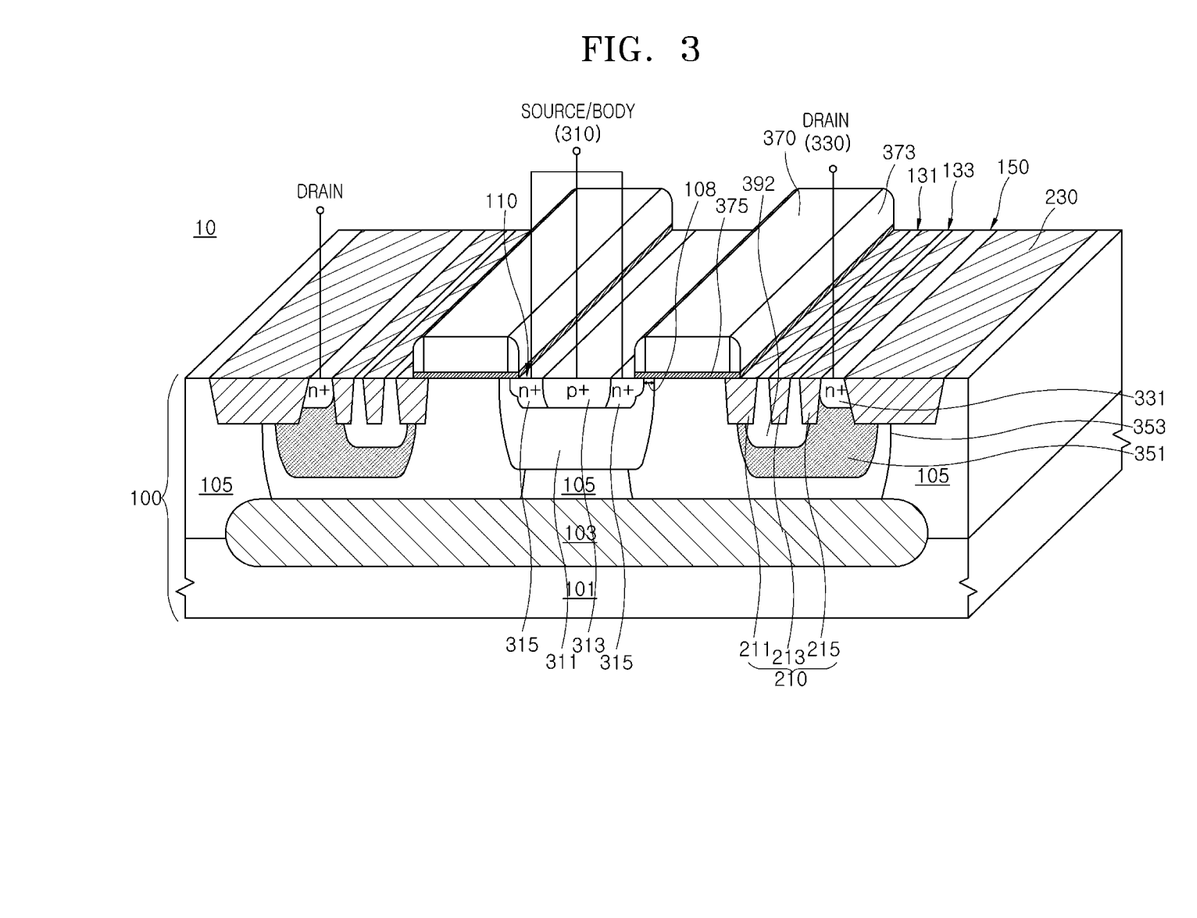
FIG. 3 is a perspective view illustrating a power integrated device according to another embodiment.

FIG. 3 is a perspective view illustrating a power integrated device 10 according to another embodiment. The power integrated device 10 may be configured in an LDMOS transistor. In FIG. 3, the same reference numerals as used in FIGS. 1 and 2 denote the same elements.

Referring to FIG. 3, the LDMOS transistor 10 may include a drift region. The drift region may include an N-type well region 354 disposed in the P-type well region 105, an N-type second drift region 351 disposed in the N-type well region 354, and a P-type top region 392 disposed in the N-type second drift region 351. Unlike in FIG. 1, the N-type second drift region 351 may be disposed to surround all of sidewalls and a bottom surface of the P-type top region 392. Thus, the N-type second drift region 351 may isolate the P-type top region 392 from the N-type well region 354. The N-type well region 354 may surround the N-type second drift region 351 and may extend to contact the P-type body region 311. In such a case, the channel region 108 may be defined as an upper region of the P-type body region 311 between the N-type source region 315 and the N-type well region 354.

The LDMOS transistor 10 may further include the insulating stripes 211, 213 and 215 that are disposed in an upper region of the substrate 100 between the drain region 331 and the gate electrode 370 to define the active stripes 131 and 133. The insulating stripes 211, 213 and 215 and the active stripes 131 and 133 may extend in the direction parallel to the drain region 331. As described above with respect to FIGS. 1 and 2, because the insulating stripes 211, 213 and 215 are formed using an STI process, loss of dopants in the N-type well region 354, the N-type second drift region 351, and the active stripes 131 and 133 may be suppressed when the insulating stripes 211, 213 and 215 are formed. As a result, degradation of an on-resistance characteristic of the LDMOS transistor 10 may be prevented.

The insulating stripes 211, 213 and 215 may induce a dielectric RESURF effect to improve a breakdown voltage characteristic of the LDMOS transistor 10. Moreover, the P-type top region 392 providing the active stripes 131 and 133 may induce a RESURF effect by creating a junction depletion region between the P-type top region 392 and the N-type second drift region 351, thereby improving breakdown voltage characteristics of the LDMOS transistor 10.

The power integrated device, for example, the LDMOS transistor 10 may be realized on a substrate together with logic circuits using a CMOS process. The LDMOS transistor may be fabricated by preparing the substrate 100 including the N-type buried layer 103 and the P-type well region 105; forming the N-type first drift region 353 or 354 in the P-type well region 105; forming the P-type body region 311 in the P-type well region 105; forming the N-type second drift region 351 and the P-type top region 391 or 392 in the N-type well region 353 or 354; forming the isolation layer 230 and the insulating stripes 211, 213 and 215 in the N-type well region 353 or 354, the N-type second drift region 351 and the P-type top region 391 or 392; forming the gate oxide layer 375 and the gate electrode 370 sequentially stacked on the N-type well region 353 or 354 between the P-type body region 311 and the insulating stripe structure 210; and forming the P-type body contact region 313, the N-type source region 315, and the N-type drain region 331 in the P-type body region 311 and the N-type second drift region 351 or using the gate electrode 370 as a mask. The isolation layer 230 and the insulating stripes 211 213 and 215 may be formed using an STI process, and interconnection lines may be formed while the gate electrode 370 is formed.

The insulating stripes 211, 213 and 215 and the active stripes 131 and 133 may be disposed in parallel to the drain region 331 or the gate electrode 370 and may be alternately and repeatedly arrayed in a direction intersecting the drain region 331 or the gate electrode 370. Accordingly, loss of dopants in the N-type well region 353 or 354, the N-type second drift region 351, and the active stripes 131 and 133 may be suppressed when the insulating stripes 211, 213 and 215 are formed. As a result, degradation of on-resistance characteristics of the LDMOS transistor 10 may be prevented. In addition, the insulating stripes 211, 213 and 215 may induce a dielectric RESURF effect to improve breakdown voltage characteristics of the LDMOS transistor 10. Moreover, the top region 391 or 392 having an opposite conductivity type to the second drift region 351 may extend into the second drift region 351 so that the active stripes 131 and 133 are formed between insulating stripes 211, 213 and 215 and in the top region 391 or 392. Thus, junction depletion regions may be formed between the top region 391 or 392 and the second drift region 351 to induce a RESURF effect and to improve breakdown voltage characteristics of the LDMOS transistor 10. As such, high performance LDMOS transistors may be realized.

The insulating stripes 211, 213 and 215 and the active stripes 131 and 133 may also be applicable to other power devices such as double diffused MOS (DMOS) transistors, DEMOS transistors, or IGBTs. Although FIGS. 1, 2 and 3 illustrate an N-channel LDMOS transistor 10, embodiments are not limited to the N-channel LDMOS transistor. For example, The LDMOS transistor may be a P-channel LDMOS transistor.

Figure 4:
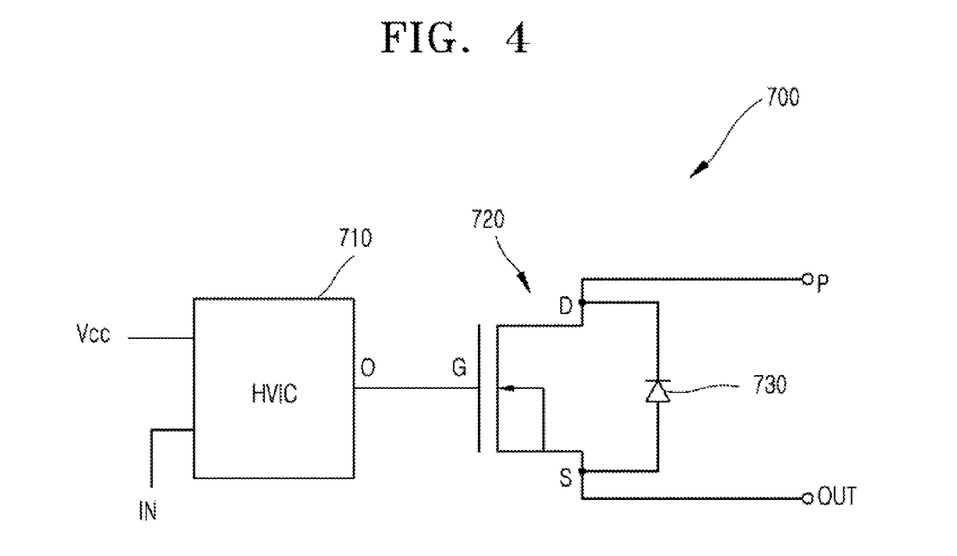
FIG. 4 is a schematic view illustrating an electronic device including a power integrated devices according to an embodiment.

FIG. 4 is a schematic view illustrating an electronic device 700 employing a power integrated device according to an embodiment. Referring to FIG. 4, the electronic device 700 may include a high voltage integrated circuit (HVIC) 710 serving as a driver circuit and a power integrated device 720 serving as a switching device. This electronic device 700 may be configured in a single phase inverter. The HVIC 710 may have a supply voltage terminal VCC, an input terminal IN, and an output terminal O. The HVIC 710 may receive a power supply voltage signal through the supply voltage terminal VCC to drive internal circuits thereof. In addition, the HVIC 710 may receive an input signal through the input terminal IN to generate an output signal. The output signal may be outputted through the output terminal O. The output terminal O may be connected to a gate terminal G of the power integrated device 720.

The power integrated device 720 may power an integrated device according to an embodiment, e.g., any of the LDMOS transistors which are described with reference to FIGS. 1 to 3. Thus, the power integrated device 720 may include a deep trench field insulation layer (i.e., the insulating stripes 211, 213 and 215) having an aspect ratio of 1 or more. That is, the depth of each of the insulating stripes 211, 213, and 215 is the same as or greater than the width thereof. The power integrated device 720 may include a drain terminal D connected to a power supply terminal P to which a power supply voltage is applied. Moreover, the power integrated device 720 may include a source terminal S connected to an output terminal OUT. A freewheeling diode 730 may be coupled in anti-parallel between the drain terminal D and the source terminal S of the power integrated device 720. The output signal of the HVIC 710 may be applied to the gate terminal G of the power integrated device 720 to turn on or turn off the power integrated device 720. If the electronic device 700 is a multi-phase inverter, the electronic device 700 may include a plurality of HVICs 710 and a plurality of power integrated devices 720. In such a case, the number of the HVICs 710 and the number power integrated devices 720 may be equal to the number of phases of the multi-phase inverter.

Figure 5:
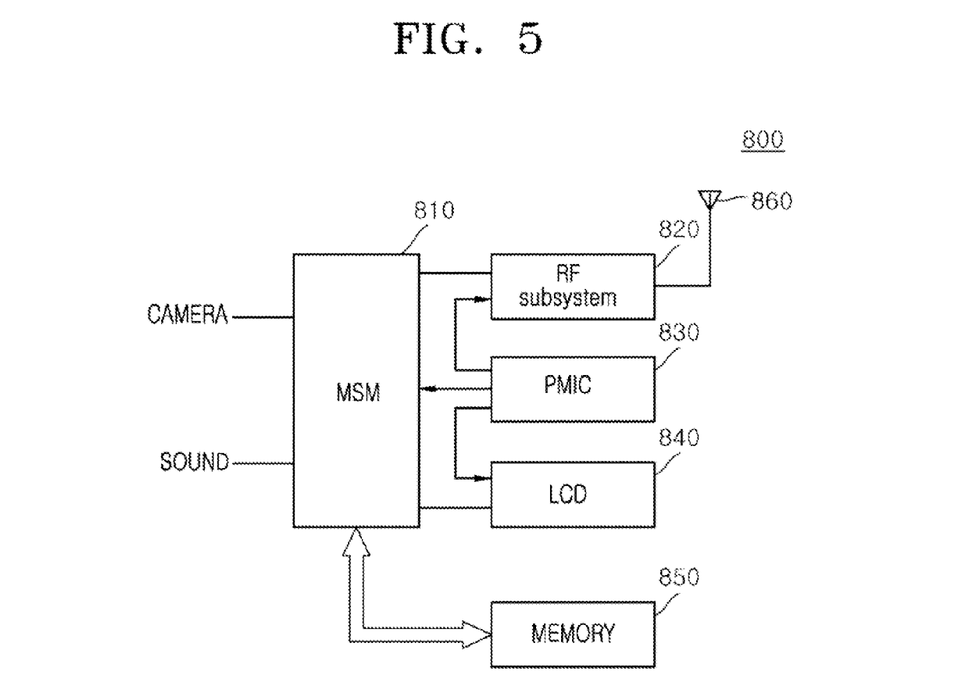
FIG. 5 is a block diagram illustrating an electronic system including a power integrated devices according to an embodiment.

FIG. 5 is a block diagram illustrating an electronic system 800 employing a power integrated device according to an embodiment. Referring to FIG. 5, the electronic system 800 may be a mobile system which may include a mobile station modem (MSM) 810, a radiofrequency (RF) subsystem 820, a power management integrated circuit (PMIC) 830, a display 840 such as a liquid crystal display (LCD), and a memory 850. The MSM 810 may include a processor for controlling overall operations of the electronic system 800, a digital signal processor (DSP) for processing audio signals and video signals, a modem for communication, and a driver. The RF subsystem 820 may be used to stably set a frequency band available for the electronic system 800 and may be used to convert an analog signal into a digital signal or vice versa. The display 840 may be an output unit of the electronic system 800. The memory 850 may include a mobile dynamic random access memory (DRAM) and a NAND flash memory that store data which are used in operations of the electronic system 800. The memory 850 may communicate with the MSM 810 through a bidirectional bus.

The electronic system 800 may further include a camera, a speaker, and an antenna 860. The camera and the speaker may be controlled by the MSM 810. Images captured by the camera may be stored in the memory 850, and image data stored in the memory 850 may be outputted through the display 840. The RF subsystem 820 may convert signals received through the antenna 860 into analog signals or digital signals. Audio signals of the signals received through the antenna 860 may be outputted through the speaker.

The PMIC 830 may receive a power supply voltage from an external device or a battery to supply the power supply voltage to various internal elements of the electronic system 800. Thus, the PMIC 830 may include a power management circuit. The power management circuit may employ the power integrated devices illustrated in FIGS. 1 to 3 as a switching device. In an embodiment, the power management circuit may include a regulator, an inverter, a converter, or a driver.

What is claimed is:

1. A power integrated device comprising:
   a gate electrode over a substrate;
   a source region and a drain region disposed in the substrate at two opposite sides of the gate electrode;
   a drift region disposed in the substrate between the gate electrode and the drain region to be spaced apart from the source region;
   a plurality of insulating stripes disposed in an upper region of the drift region and defining at least one active stripe between the plurality of insulating stripes; and
   a top region being disposed in the upper region of the drift region and adjacent to a sidewall of the drain region,
   wherein the plurality of insulating stripes is disposed in an upper region of the top region.

2. The power integrated device of claim 1,
   wherein the plurality of insulating stripes extend in parallel to each other; and
   wherein the at least one active stripe is in parallel to the drain region.

3. The power integrated device of claim 1, wherein the at least one active stripe extends in parallel to the drain region, and
   wherein the plurality of insulating stripes extend in parallel to the drain region.

4. The power integrated device of claim 1, wherein the at least one active stripe extends in parallel to the gate electrode, and
   wherein the plurality of insulating stripes extend in parallel to the gate electrode.

5. The power integrated device of claim 1, wherein the plurality of insulating stripes are in parallel to each other.

6. The power integrated device of claim 1,
   wherein the plurality of insulating stripes extend in parallel to each other, and
   wherein the at least one active stripe is in parallel to the gate electrode.

7. The power integrated device of claim 1, wherein the plurality of insulating stripes include trench isolation layers which are spaced apart from each other.

8. The power integrated device of claim 1,
   wherein the drift region includes a second drift region of a first conductivity; and
   wherein the drain region is disposed in an upper region of the second drift region, has the first conductivity, and has an impurity concentration higher than an impurity concentration of the second drift region.

9. The power integrated device of claim 8, wherein the drift region further includes a first drift region of a first conductivity, and
   wherein the first drift region surrounds the second drift region.

10. The power integrated device of claim 8,
    wherein the top region has a second conductivity which is opposite to the first conductivity.

11. The power integrated device of claim 10,
    wherein the top region is formed shallower than the second drift region, and
    wherein the top region laterally extends into the substrate adjacent to the gate electrode.

12. The power integrated device of claim 10, wherein the second drift region surrounds all of sidewalls and a bottom surface of the top region.

13. The power integrated device of claim 10, wherein the plurality of insulating stripes includes trench isolation layers which are shallower than the top region.

14. The power integrated device of claim 10, wherein the first conductivity is N-type conductivity and the second conductivity is P-type conductivity.

15. The power integrated device of claim 10, wherein the first conductivity is P-type conductivity and the second conductivity is N-type conductivity.

16. The power integrated device of claim 1, further comprising a body region surrounding the source region,
    wherein the body region has a conductivity that is opposite to the source region.

17. The power integrated device of claim 16, wherein an upper region of the body region, between the source region and the drift region, serves as a channel region.

18. A power integrated device comprising:
    a drift region of a first conductivity and a body region of a second conductivity, which are disposed in a substrate of the second conductivity;
    a source region of the first conductivity disposed in an upper region of the body region;
    a gate electrode disposed over the body region between the source region and the drift region;
    a drain region of the first conductivity disposed in an upper region of the drift region and spaced apart from the gate electrode;
    a plurality of insulating stripes disposed in the upper region of the drift region and defining at least one active stripe between the plurality of insulating stripes; and
    a top region being disposed in the upper region of the drift region and adjacent to a sidewall of the drain region,
    wherein the plurality of insulating stripes is disposed in an upper region of the top region, and
    wherein the at least one active stripe is in parallel to the drain region.

19. A power integrated device comprising:
    a drift region of a first conductivity and a body region of a second conductivity, which are disposed in a substrate of the second conductivity type;
    a top region of the second conductivity disposed in an upper region of the drift region;
    a source region of the first conductivity disposed in an upper region of the body region;
    a gate electrode disposed over the body region between the source region and the drift region, a drain region of the first conductivity disposed in an upper region of the drift region and spaced apart from the gate electrode; and
    a plurality of insulating stripes disposed in an upper region of the top region and defining at least one active stripe between plurality of insulating stripes,
    wherein the at least one active stripe is in parallel to the drain region.

* * * * *